United States Patent
Tu et al.

(10) Patent No.: US 12,460,136 B2
(45) Date of Patent: Nov. 4, 2025

(54) FLAME-RETARDANT COMPOSITION

(71) Applicant: CHANG CHUN PLASTICS CO., LTD., Taipei (TW)

(72) Inventors: An-Pang Tu, Taipei (TW); Shih-De Yang, Taipei (TW)

(73) Assignee: Chang Chun Plastics Co., Ltd., Taipei (TW)

( * ) Notice: Subject to any disclaimer, the term of this patent is extended or adjusted under 35 U.S.C. 154(b) by 0 days.

(21) Appl. No.: 18/792,792

(22) Filed: Aug. 2, 2024

(65) Prior Publication Data
US 2025/0051645 A1 Feb. 13, 2025

Related U.S. Application Data

(60) Provisional application No. 63/517,269, filed on Aug. 2, 2023.

(30) Foreign Application Priority Data

Jun. 21, 2024 (TW) ................. 113123202

(51) Int. Cl.
| | |
|---|---|
| C09K 21/12 | (2006.01) |
| B32B 15/08 | (2006.01) |
| C08F 216/12 | (2006.01) |
| C08J 5/24 | (2006.01) |
| C08L 29/10 | (2006.01) |
| C08L 43/02 | (2006.01) |
| C08L 79/08 | (2006.01) |
| C09D 5/18 | (2006.01) |
| C09D 129/10 | (2006.01) |
| C09K 21/14 | (2006.01) |
| H05K 1/03 | (2006.01) |

(52) U.S. Cl.
CPC .......... *C09K 21/14* (2013.01); *C08F 216/125* (2013.01); *C08J 5/24* (2013.01); *C08L 29/10* (2013.01); *C09D 5/18* (2013.01); *C09D 129/10* (2013.01); *C08J 2329/10* (2013.01); *H05K 1/0366* (2013.01); *H05K 2201/012* (2013.01)

(58) Field of Classification Search
CPC .......... C08L 43/00; C08L 43/02; C08L 79/08; C08J 5/24; B32B 15/08
USPC ............... 525/205; 428/297.4, 457
See application file for complete search history.

(56) References Cited

FOREIGN PATENT DOCUMENTS

| | | | |
|---|---|---|---|
| CN | 102276836 A | * 12/2011 | |
| CN | 104877134 A | * 9/2015 | |
| CN | 109504087 A | * 3/2019 | ............ B32B 15/08 |
| TW | 1606057 B | * 11/2017 | |
| TW | 201803882 A | 1/2018 | |

OTHER PUBLICATIONS

Machine translation of CN-102276836-A (no date).*
Machine translation of CN-109504087-A (no date).*
Lin, C.H., Wong, T.I., Wang, M.W., Chang, H.C. and Juang, T.Y. (2015), Synthesis of diallyl-containing polyimide and the effect of allyl groups on properties. J. Polym. Sci. Part A: Polym. Chem., 53: 513-520. https://doi.org/10.1002/pola.27459 (Year: 2015).*
Machine Translation of TW-1606057-B (no date).*

* cited by examiner

*Primary Examiner* — Michael J Feely
(74) *Attorney, Agent, or Firm* — Christensen, Fonder, Dardi & Herbert PLLC; John P. Fonder (57) ABSTRACT

A flame-retardant composition is provided. The flame-retardant composition comprises:
(A) a compound having the structure of formula (I),

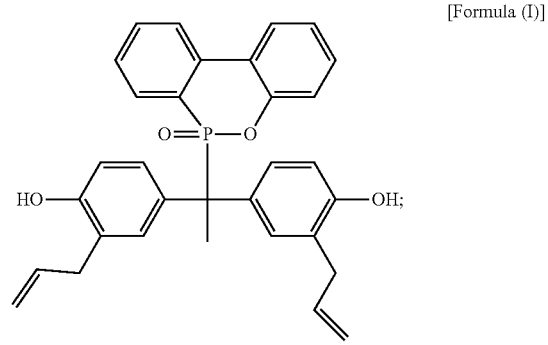

[Formula (I)]

(B) a maleimide compound; and
(C) an allyl-containing compound, having a structure different from formula (I),
wherein the flame-retardant composition has a phosphorus content ranging from 0.5 wt % to 1.4 wt % based on the total weight of the flame-retardant composition excluding solvent.

20 Claims, 2 Drawing Sheets

FLAME-RETARDANT COMPOSITION

CLAIM FOR PRIORITY

This application claims the benefit of U.S. Provisional Application No. 63/517,269 filed on Aug. 2, 2023 and the benefit of Taiwan Patent Application No. 113123202 filed on Jun. 21, 2024, the subject matters of which are incorporated herein in their entirety by reference.

BACKGROUND OF THE INVENTION

Field of the Invention

The present invention provides a flame-retardant composition, especially a flame-retardant composition comprising a phosphorus-containing compound with a specific structure. The present invention also provides a prepreg and a metal-clad laminate prepared by using the flame-retardant composition.

Descriptions of the Related Art

Electronic materials used for printed circuit boards must possess a certain level of flame retardancy to meet relevant standards. Generally, this can be achieved by adding phosphorus to the electronic materials to enhance overall flame retardancy. The phosphorus can be added through the incorporation of phosphorus-containing compounds, with common examples including 9,10-dihydro-9-oxa-10-phospha-phenanthrene-10-oxide (DOPO). However, while adding DOPO may enhance the flame retardancy of electronic materials, it cannot increase the molecular weight of resin or extend the resin's molecular chain, which adversely affects other properties of the resin, such as electrical and thermal resistance characteristics.

Other known phosphorus-containing compounds include bishydroxy-type DOPO-based compounds, such as 10-(2,5-dihydroxyphenyl)-9,10-dihydro-9-oxa-10-phospha-phenanthrene-10-oxide and dihydroxyphenyl(diphenyl)phosphine oxide. These phosphorus-containing compounds can address the issue of inability to extend molecular chains, but the hydroxyl groups they possess prevent them from combining with other high-performance resins (e.g., bismaleimide resins). As a result, the electronic materials in which they are applied still fail to meet expectations in terms of thermal resistance and dimensional stability.

SUMMARY OF THE INVENTION

In view of the aforementioned technical problems, the present invention provides a flame-retardant composition, which comprises a phosphorus-containing compound with a specific structure, a maleimide compound, and an allyl-containing compound without the aforementioned specific structure. Through this combination of components, the flame-retardant composition of the present invention can provide electronic materials that simultaneously possess excellent flame retardancy, superior thermal resistance and good dimensional stability.

Thus, an objective of the present invention is to provide a flame-retardant composition, which comprises the following components:

(A) a compound having the structure of formula (I),

[Formula (I)]

(B) a maleimide compound; and
(C) an allyl-containing compound, having a structure different from formula (I),
  wherein the flame-retardant composition has a phosphorus content ranging from 0.5 wt % to 1.4 wt % based on the total weight of the flame-retardant composition excluding solvent.

In one embodiment of the present invention, based on the total weight of the flame-retardant composition excluding solvent, the content of the compound (A) ranges from 8 wt % to 20 wt %.

In one embodiment of the present invention, based on the total weight of the flame-retardant composition excluding solvent, the content of the maleimide compound (B) ranges from 20 wt % to 55 wt %.

In one embodiment of the present invention, based on the total weight of the flame-retardant composition excluding solvent, the content of the allyl-containing compound (C) ranges from 20 wt % to 55 wt %.

In one embodiment of the present invention, the maleimide compound (B) is a multi-functional maleimide compound, preferably a bismaleimide compound.

In one embodiment of the present invention, the maleimide compound (B) is selected from the group consisting of and combinations thereof, wherein n is an integer ranging from 1 to 10.

In one embodiment of the present invention, the maleimide compound (B) is selected from the group consisting of 1,2-bismaleimidoethane, 1,6-bismaleimidohexane, 1,3-bismaleimidobenzene, 1,4-bismaleimidobenzene, 2,4-bismaleimidotoluene, 4,4'-bismaleimidodiphenylmethane, 4,4'-bismaleimidodiphenyl ether, 3,3'-bismaleimidodiphenyl sulfone, 4,4'-bismaleimidodiphenyl sulfone, 4,4'-bismaleimidodicyclohexylmethane, 3,5-bis(4-maleimidophenyl) pyridine, 2,6-bismaleimidopyridine, 1,3-bis(maleimidomethyl)cyclohexane, 1,3-bis(maleimidomethyl)benzene, 1,1-bis(4-maleimidophenyl)cyclohexane, 1,3-bis(dichloromaleimido)benzene, 4,4'-biscitraconimidodiphenylmethane, 2,2-bis(4-maleimidophenyl)propane, 1-phenyl-1,1-bis(4-maleimidophenyl)ethane, α,α-bis(4-maleimidophenyl) toluene, 3,5-bismaleimido-1,2,4-triazole, N,N'-ethylenebismaleimide, N,N'-hexamethylenebismaleimide, N,N'-m-phenylenebismaleimide, N,N'-p-phenylenebismaleimide, N,N'-4,4'-diphenylmethane bismaleimide, N,N'-4,4'-diphenylether bismaleimide, N,N'-4,4'-diphenylsulfone bismaleimide, N,N'-4,4'-dicyclohexylmethane bismaleimide, N,N'-α,α'-4,4'-dimethylenecyclohexane bismaleimide, N,N'-m-dimethylphenylbismaleimide, N,N'-4,4'-diphenylcyclohexane bismaleimide, a phenylmethane maleimide oligomer, and combinations thereof.

In one embodiment of the present invention, the allyl-containing compound (C) is a multi-functional allyl-containing compound. Preferably, the allyl-containing compound (C) is selected from the group consisting of diallyl bisphenol A, diallyl bisphenol F, diallyl bisphenol S, and combinations thereof.

In one embodiment of the present invention, the flame-retardant composition further comprises a prepolymer of the compound (A), the maleimide compound (B) and the allyl-containing compound (C).

In one embodiment of the present invention, the prepolymer has a structure of the following formula (II) or formula (III):

wherein $R_B$ is a structural unit derived from the maleimide compound (B), and $R_C$ is a structural unit derived from the allyl-containing compound (C).

In one embodiment of the present invention, the flame-retardant composition further comprises a thermosetting resin selected from the group consisting of an epoxy resin, a thermosetting phenolic resin, a thermosetting benzoxazine resin, a thermosetting polyphenylene ether resin, and combinations thereof.

In one embodiment of the present invention, the flame-retardant composition further comprises an additive selected from the group consisting of a hardening promoter, a catalyst, an elastomer, a filler, a toughener, and combinations thereof.

Another objective of the present invention is to provide a prepreg, which is prepared by impregnating a substrate with the aforementioned flame-retardant composition or by coating the aforementioned flame-retardant composition onto a substrate and drying the impregnated or coated substrate.

Yet another objective of the present invention is to provide a metal-clad laminate, which is prepared by laminating the aforementioned prepreg and a metal foil, or by coating the aforementioned flame-retardant composition onto a metal foil and drying the coated metal foil.

To render the above objectives, technical features and advantages of the present invention more apparent, the present invention will be described in detail with reference to some embodiments hereinafter.

[Formula (II)]

[Formula (III)]

DESCRIPTION OF THE PREFERRED EMBODIMENTS

Hereinafter, some embodiments of the present invention will be described in detail. However, the present invention may be embodied in various embodiments and should not be limited to the embodiments described in the specification.

Unless otherwise specified, the expressions "a," "the," or the like recited in the specification and claims should include both the singular and the plural forms.

Unless otherwise specified, in the specification and claims, the term "room temperature" refers to a temperature of 25° C.

Unless otherwise specified, while describing the amount of components in solutions, mixtures, compositions or varnishes in the specification and claims, the weight of the solvent is not included in the calculation.

The flame-retardant composition of the present invention features in the combined use of a phosphorus-containing compound with a specific structure, a maleimide compound, and an allyl-containing compound, thereby providing an electronic material that simultaneously possesses excellent flame retardancy, superior thermal resistance, and good dimensional stability. The electronic material is particularly suitable for use as a dielectric material in printed circuit boards. The following provides a detailed description of the flame-retardant composition and its applications.

1. FLAME-RETARDANT COMPOSITION

The flame-retardant composition of the present invention comprises a compound (A) having a structure of the following formula (I), a maleimide compound (B), and an allyl-containing compound (C). The allyl-containing compound (C) has a structure different from the following formula (I).

[Formula (I)]

The flame-retardant composition has a phosphorus content ranging from 0.5 wt % to 1.4 wt % based on the total weight of the flame-retardant composition excluding solvent. For example, based on the total weight of the flame-retardant composition excluding solvent, the phosphorus content of the flame-retardant composition can be 0.5 wt %, 0.6 wt %, 0.7 wt %, 0.8 wt %, 0.9 wt %, 1.0 wt %, 1.1 wt %, 1.2 wt %, 1.3 wt %, or 1.4 wt %, or within a range between any two of the values described herein. When the phosphorus content is below the specified range, the resulting electronic material cannot achieve satisfactory flame retardancy and thermal resistance. When the phosphorus content is above the specified range, although the resulting electronic material can achieve good flame retardancy and thermal resistance, its mechanical properties and dielectric properties deteriorate.

1.1. (A) Compound Having a Structure of Formula (I)

In the flame-retardant composition of the present invention, the compound (A) is a compound with a specific structure, and the specific structure is represented by the following formula (I):

[Formula (I)]

Unlike DOPO or bisphenol-type DOPO-based compounds, the compound (A) having the structure of formula (I) contains allyl as a reactive functional group in addition to the basic DOPO structure. This allows it to react with other unsaturated resins (e.g., bismaleimide resins) and extend the molecular chain of resins, thereby further enhancing the flame retardancy.

In the flame-retardant composition of the present invention, based on the total weight of the flame-retardant composition excluding solvent, the content of the compound (A) having the structure of formula (I) can range from 8 wt % to 20 wt %. For example, based on the total weight of the flame-retardant composition excluding solvent, the content of the compound (A) having the structure of formula (I) can be 8 wt %, 9 wt %, 10 wt %, 11 wt %, 12 wt %, 13 wt %, 14 wt %, 15 wt %, 16 wt %, 17 wt %, 18 wt %, 19 wt %, or 20 wt %, or within a range between any two of the values described herein. When the content of the compound (A) having the structure of formula (I) is below the specified range, the resulting electronic material cannot achieve satisfactory flame retardancy and thermal resistance. When the content of the compound (A) having the structure of formula (I) is above the specified range, the resulting electronic material may have deteriorated mechanical properties and dielectric properties.

The compound (A) having the structure of formula (I) can be prepared in the following manner. First, DOPO is reacted with at least two hydroxyphenyl-containing compounds in the presence of p-toluenesulfonic acid to obtain a bisphenol-type DOPO-based compound. Next, the bisphenol-type DOPO-based compound is reacted with an allyl-containing compound to obtain a DOPO group-containing diallyl ether compound. Subsequently, at high temperature, the DOPO group-containing diallyl ether compound undergoes a functional group rearrangement (Claisen rearrangement) to yield the compound (A) having the structure of formula (I).

Examples of the hydroxyphenyl-containing compound include, but are not limited to, phenol, p-benzenediol, m-benzenediol, o-benzenediol, 4'-hydroxyacetophenone,

3'-hydroxyacetophenone, 2'-hydroxyacetophenone, p-hydroxybenzoic acid, m-hydroxybenzoic acid, and o-hydroxybenzoic acid. The hydroxyphenyl-containing compounds can be used alone or in a mixture of two or more. Examples of the allyl-containing compound include, but are not limited to, allyl chloride, allyl bromide, allyl iodide, allyl alcohol, and allylamine. The allyl-containing compounds can be used alone or in a mixture of two or more.

1.2. (B) Maleimide Compound

In the flame-retardant composition of the present invention, the maleimide compound (B) is a compound having a maleimide structure. The maleimide structure has reactive carbon-carbon double bond(s), making the maleimide compound (B) capable of reacting with other components containing unsaturated groups. Examples of the unsaturated groups include, but are not limited to, vinyl, vinyl benzyl, allyl, acrylate group and methacrylate group.

The maleimide compound (B) is preferably a multi-functional maleimide compound, such as a bismaleimide compound, a trismaleimide compound, or a tetramaleimide compound. More preferably, the maleimide compound (B) is a bismaleimide compound.

In one embodiment of the present invention, the maleimide compound (B) is selected from the group consisting of and combinations thereof, wherein n is an integer ranging from 1 to 10.

In one embodiment of the present invention, the maleimide compound (B) is selected from the group consisting of 1,2-bismaleimidoethane, 1,6-bismaleimidohexane, 1,3-bismaleimidobenzene, 1,4-bismaleimidobenzene, 2,4-bismaleimidotoluene, 4,4'-bismaleimidodiphenylmethane, 4,4'-bismaleimidodiphenyl ether, 3,3'-bismaleimidodiphenyl sulfone, 4,4'-bismaleimidodiphenyl sulfone, 4,4'-bismaleimidodicyclohexylmethane, 3,5-bis(4-maleimidophenyl)pyridine, 2,6-bismaleimidopyridine, 1,3-bis(maleimidomethyl)cyclohexane, 1,3-bis(maleimidomethyl)benzene, 1,1-bis(4-maleimidophenyl)cyclohexane, 1,3-bis(dichloromaleimido)benzene, 4,4'-biscitraconimidodiphenylmethane, 2,2-bis(4-maleimidophenyl)propane, 1-phenyl-1,1-bis(4-maleimidophenyl)ethane, α,α-bis(4-maleimidophenyl) toluene, 3,5-bismaleimido-1,2,4-triazole, N,N'-ethylenebismaleimide, N,N'-hexamethylenebismaleimide, N,N'-m-phenylenebismaleimide, N,N'-p-phenylenebismaleimide, N,N'-4,4'-diphenylmethane bismaleimide, N,N'-4,4'-diphenylether bismaleimide, N,N'-4,4'-diphenylsulfone bismaleimide, N,N'-4,4'-dicyclohexylmethane bismaleimide, N,N'-α,α'-4,4'-dimethylenecyclohexane bismaleimide, N,N'-m-dimethylphenylbismaleimide, N,N'-4,4'-diphenylcyclohexane bismaleimide, a phenylmethane maleimide oligomer, and combinations thereof. The aforementioned maleimide compounds can be used alone or in a mixture of two or more.

In the flame-retardant composition of the present invention, based on the total weight of the flame-retardant composition excluding solvent, the content of the maleimide compound (B) can range from 20 wt % to 55 wt %. For example, based on the total weight of the flame-retardant composition excluding solvent, the content of the maleimide compound (B) can be 20 wt %, 21 wt %, 22 wt %, 23 wt %, 24 wt %, 25 wt %, 26 wt %, 27 wt %, 28 wt %, 29 wt %, 30 wt %, 31 wt %, 32 wt %, 33 wt %, 34 wt %, 35 wt %, 36 wt %, 37 wt %, 38 wt %, 39 wt %, 40 wt %, 41 wt %, 42 wt %, 43 wt %, 44 wt %, 45 wt %, 46 wt %, 47 wt %, 48 wt %, 49 wt %, 50 wt %, 51 wt %, 52 wt %, 53 wt %, 54 wt %, or 55 wt %, or within a range between any two of the values described herein.

1.3. (C) Allyl-Containing Compound

As used herein, the allyl-containing compound (C) refers to a compound that contains allyl and have a structure different from the aforementioned formula (I). The allyl-containing compound is preferably a multi-functional allyl-containing compound, especially a diallyl compound. Examples of the diallyl compound include, but are not limited to, diallyl bisphenol A, diallyl bisphenol F, and diallyl bisphenol S. The aforementioned diallyl compounds can be used alone or in a mixture of two or more.

In the flame-retardant composition of the present invention, based on the total weight of the flame-retardant composition excluding solvent, the content of the allyl-containing compound (C) can range from 20 wt % to 55 wt %. For example, based on the total weight of the flame-retardant composition excluding solvent, the content of the allyl-containing compound (C) can be 20 wt %, 21 wt %, 22 wt %, 23 wt %, 24 wt %, 25 wt %, 26 wt %, 27 wt %, 28 wt %, 29 wt %, 30 wt %, 31 wt %, 32 wt %, 33 wt %, 34 wt %, 35 wt %, 36 wt %, 37 wt %, 38 wt %, 39 wt %, 40 wt %, 41 wt %, 42 wt %, 43 wt %, 44 wt %, 45 wt %, 46 wt %, 47 wt %, 48 wt %, 49 wt %, 50 wt %, 51 wt %, 52 wt %, 53 wt %, 54 wt %, or 55 wt %, or within a range between any two of the values described herein.

1.4. Other Components and Prepolymer

The flame-retardant composition of the present invention can further comprise thermosetting components other than the maleimide compound (B) to adaptively improve the physicochemical properties or electrical properties of manufactured electronic materials. Examples of the thermosetting components include, but are not limited to, a thermosetting resin selected from the group consisting of an epoxy resin, a thermosetting phenolic resin, a thermosetting benzoxazine resin, and a thermosetting polyphenylene ether resin. These thermosetting resins can be used alone or in a mixture of two or more.

The flame-retardant composition of the present invention can further comprise conventional additives to adaptively improve the physicochemical properties or electrical properties of manufactured electronic materials. Examples of the additives include, but are not limited to, a hardener, a catalyst, an elastomer, a filler, a dispersing agent, a toughener, a viscosity modifying agent, a chelating agent, and the like. These additives can be used alone or in a mixture of two or more. The selection of additives is something that those of ordinary skill in the art can choose according to actual needs after reading this specification and it is not the technical focus of the present invention. Therefore, it will not be further elaborated here.

In addition, each component of the flame-retardant composition of the present invention can exist in the composition in the form of monomers, or it can exist in the form of prepolymers. Therefore, the flame-retardant composition can further comprise one or more prepolymers. Examples of the prepolymer include, but are not limited to, a prepolymer of the compound (A) having the structure of formula (I) and the maleimide compound (B), a prepolymer of the maleimide compound (B) and the allyl-containing compound (C), and a prepolymer of the compound (A) having the structure of formula (I), the maleimide compound (B), and the allyl-containing compound (C).

In one embodiment of the present invention, the flame-retardant composition further comprises a prepolymer having the structure of the following formula (II) or formula (III):

In one embodiment of the present invention, the infrared spectrum obtained by FTIR using the transmission method for the flame-retardant composition shows a P—O-Ph absorption peak at 751 $cm^{-1}$ to 760 $cm^{-1}$, a C=O absorption peak at 1705 $cm^{-1}$ to 1715 $cm^{-1}$, and a C=C absorption peak at 1637 $cm^{-1}$ to 1639 $cm^{-1}$.

In addition, the cured product obtained after curing the flame-retardant composition of the present invention possesses excellent flame retardancy and thermal resistance. In one embodiment of the present invention, the glass transition temperature (Tg) of the cured product of the flame-retardant composition can reach 180° C. to 220° C. For example, the Tg of the cured product of the flame-retardant composition can be 180° C., 185° C., 190° C., 195° C., 200° C., 205° C., 210° C., 215° C., or 220° C., or within a range between any two of the values described herein. The 5% weight loss temperature ($T_d5$) of the cured product of the flame-retardant composition can reach 360° C. to 385° C. For example, the $T_d5$ of the cured product of the flame-retardant composition can be 360° C., 365° C., 370° C., 375° C., 380° C., or 385° C., or within a range between any two of the values described herein. The carbon residue at 800° C. (hereinafter also "800° C. carbon residue") of the cured product of the flame-retardant composition can reach 42 wt % to 48 wt %. For example, the 800° C. carbon residue of the cured product of the flame-retardant composition can be 42 wt %, 43 wt %, 44 wt %, 45 wt %, 46 wt %, 47 wt %, or 48 wt %, or within a range between any two of the values described herein.

[Formula (II)]

[Formula (III)]

in formula (II) and formula (III), $R_B$ is a structural unit derived from the maleimide compound (B), and $R_C$ is a structural unit derived from the allyl-containing compound (C).

1.5. Properties of Flame-Retardant Composition

Functional groups contained in the flame-retardant composition of the present invention can be analyzed by FTIR.

Furthermore, the cured product obtained after curing the flame-retardant composition of the present invention also exhibits excellent dimensional stability. In one embodiment of the present invention, the total expansion of the cured product of the flame-retardant composition is only 1.8% to 2.3% in the temperature range from 50° C. to 260° C. For example, the total expansion of the cured product of the flame-retardant composition in the temperature range from 50° C. to 260° C. can be 1.8%, 1.9%, 2.0%, 2.1%, 2.2%, or 2.3%, or within a range between any two of the values described herein.

1.6. Preparation of Flame-Retardant Composition

The flame-retardant composition of the present invention can be prepared by uniformly mixing and dissolving or dispersing the components of the flame-retardant composition, including the compound (A) having the structure of formula (I), the maleimide compound (B), the allyl-containing compound (C), and other optional components (e.g., thermosetting resins or additives), in a solvent using a stirrer to form a slurry, a colloidal group, or a varnish for subsequent processing. The solvent can be any inert solvent that can dissolve or disperse the components of the flame-retardant composition without reacting with these components. Examples of the solvents that can dissolve or disperse the components of the flame-retardant composition include, but are not limited to, toluene, γ-butyrolactone, methyl ethyl ketone, cyclohexanone, butanone, acetone, xylene, methyl isobutyl ketone, N,N-dimethylformamide (DMF), N,N-dimethylacetamide (DMAc), propylene glycol methyl ether, dimethyl sulfoxide, and N-methylpyrrolidone (NMP). These solvents can be used alone or in a mixture of two or more. There are no special restrictions on the amount of solvent, as it is sufficient in principle as long as it can uniformly dissolve or disperse all components of the flame-retardant composition.

In addition, prepolymers can be formed by polymerizing the reactive components in the flame-retardant composition through heating, resulting in a flame-retardant composition containing prepolymers. For example, the maleimide compound (B) and the allyl-containing compound (C) are mixed to obtain a mixture. Then, the mixture is heated to 120° C. to 180° C., or in the presence of a catalyst, heated to 80° C. to 180° C., after which the compound (A) having a structure of formula (I) is added. The mixture is then stirred for 10 minutes to 1 (one) hour to react and form prepolymers. Subsequently, solvent is added to obtain a flame-retardant composition containing prepolymers.

2. PREPREG AND METAL-CLAD LAMINATE

The present invention also provides a prepreg prepared by impregnating a substrate with the aforementioned flame-retardant composition, or coating the aforementioned flame-retardant composition onto a substrate, and drying the impregnated or coated substrate. The substrate may be a reinforcing material. Generally, the reinforcing material can include fibers selected from the group consisting of glass fibers, inorganic fibers other than glass fibers, organic fibers, and combinations thereof, but the reinforcing material is not limited thereto. Examples of glass fibers include, but are not limited to, E-glass fibers, NE-glass fibers, S-glass fibers, L-glass fibers, D-glass fibers, T-glass fibers, Q-glass fibers, UN-glass fibers, and spherical glass. Examples of inorganic fibers other than glass fibers include, but are not limited to, quartz fibers, paper fibers, and carbon fibers. Examples of organic fibers include, but are not limited to, polyimide, polyamide (e.g., Kevlar), polyester, liquid crystal polymer (e.g., liquid crystal polyester), polytetrafluoroethylene, ultra-high molecular weight polyethylene (UHMWPE), and high-modulus polypropylene (HMPP). The forms of the reinforcing material include, but are not limited to, woven fabric, non-woven fabric, roving, chopped strand mat, and surfacing mat.

Furthermore, the present invention also provides a metal-clad laminate prepared from the aforementioned prepreg. The metal-clad laminate comprises a dielectric layer and a metal layer, wherein the dielectric layer is provided by the prepreg as described above. Multiple layers of the aforementioned prepreg can be superimposed, and a metal foil (such as copper foil) can be superimposed on at least one outer surface of the dielectric layer composed of the superimposed prepregs to provide a superimposed object. The superimposed object then undergoes a hot-pressing operation to obtain the metal-clad laminate. Alternatively, the metal-clad laminate may be prepared by coating the flame-retardant composition of the present invention onto a metal foil and drying the coated metal foil.

The outer metal foil of the metal-clad laminate can be further patterned to produce a printed circuit board.

3. EXAMPLES

3.1. Testing Methods

The present invention is further illustrated by the embodiments hereinafter, wherein the testing instruments and methods are as follows.

[FTIR Measurement]

First, 1 (one) mg of the flame-retardant composition is coated onto a KBr pellet with a diameter of 13 mm and a thickness of 1 (one) mm using a thin film method. Subsequently, the coated KBr pellet is placed in a Fourier transform infrared spectrometer (model: Spotlight 200i, available from PerkinElmer) to measure the infrared spectrum of the flame-retardant composition in the range of 400 cm$^{-1}$ to 4000 cm$^{-1}$. The measurement conditions are as follows: measurement by transmission method, a resolution of 1 cm$^{-1}$, and a scan number of 16.

[Measurement of 5% Weight Loss Temperature ($T_d5$)]

First, the flame-retardant composition is cured under the following conditions to obtain the cured product of the flame-retardant composition: heating from room temperature to 180° C. and holding for one hour, then heating to 200° C. and holding for 2 hours, followed by further heating to 250° C. and holding for 6 hours, then naturally cooling to room temperature. Subsequently, 5 mg to 10 mg of the cured product is taken as a sample and placed on a platinum plate. A thermogravimetric analyzer (TGA, model: TGA-Q500, available from TA Instruments) is used to measure the $T_d5$ of the sample according to IPC-TM-650-2.3.40. Measurement conditions are as follows: sample equilibration at 50° C., followed by heating at a heating rate of 10° C./min to 800° C., and $T_d5$ is calculated using the software provided with the TGA.

[Measurement of 800° C. Carbon Residue]

First, the flame-retardant composition is cured under the following conditions to obtain the cured product of the flame-retardant composition: heating from room temperature to 180° C. and holding for one hour, then heating to 200° C. and holding for 2 hours, followed by further heating to 250° C. and holding for 6 hours, then naturally cooling to room temperature. Subsequently, 5 mg to 10 mg of the cured product is taken as a sample and placed on a platinum plate. A thermogravimetric analyzer TGA-Q500 is used to measure the 800° C. carbon residue of sample according to IPC-TM-650-2.3.40. Measurement conditions are as follows: sample equilibration at 50° C., followed by heating at a heating rate of 10° C./min from 50° C. to 800° C., and the 800° C. carbon residue is calculated using the software provided with the TGA.

[Measurement of Glass Transition Temperature (Tg)]

First, the flame-retardant composition is cured under the following conditions to obtain the cured product of the flame-retardant composition: heating from room temperature to 180° C. and holding for one hour, then heating to 200° C. and holding for 2 hours, followed by further heating to 250° C. and holding for 6 hours, then naturally cooling to room temperature. Subsequently, the cured product is cut into specimen blocks with volumes ranging from 3 cubic centimeters to 7 cubic centimeters. A thermomechanical analyzer (TMA, model: TMA-7, available from PerkinElmer) is used to measure the Tg of the specimen according to IPC-TM-650-2.4.24. Measurement conditions are as follows: sample equilibration at 50° C., followed by heating at a heating rate of 10° C./min from 50° C. to 330° C., cooling at a cooling rate of 10° C./min from 330° C. to 50° C., and then reheating at a heating rate of 10° C./min from 50° C. to 330° C. Tg is calculated using the software provided with the TMA.

[Measurement of Coefficient of Thermal Expansion]

First, the flame-retardant composition is cured under the following conditions to obtain the cured product of the flame-retardant composition: heating from room temperature to 180° C. and holding for one hour, then heating to 200° C. and holding for 2 hours, followed by further heating to 250° C. and holding for 6 hours, then naturally cooling to room temperature. Then, the cured product is cut into specimen blocks with volumes ranging from 3 cubic centimeters to 7 cubic centimeters. A thermomechanical analyzer TMA-7 is used to measure the total expansion from 50° C. to 260° C. according to IPC-TM-650-2.4.24. Measurement conditions are as follows: sample equilibration at 50° C., followed by heating at a heating rate of 10° C./min from 50° C. to 330° C., cooling at a cooling rate of 10° C./min from 330° C. to 50° C., and then reheating at a heating rate of 10° C./min from 50° C. to 330° C. The total expansion of thermal expansion from 50° C. to 260° C. is calculated using the software provided with the TMA.

[Flame Retardancy Test]

The flame retardancy level of each flame-retardant composition is determined according to UL 94 vertical burning test. To compare the flame retardancy of each flame-retardant composition, glass fiber cloth 2116 is impregnated separately with the flame-retardant compositions of Examples 1 to 3 and Comparative Examples 1 to 6, baked at 150° C. for 7 minutes, to prepare prepregs. Subsequently, each prepreg is cut into test pieces with an area of 13×13 square centimeters, covered with copper foil on both sides, and hot-pressed in vacuum at 220° C. for 2 hours to prepare test specimens. The test specimen is cut into 13×1.3 square centimeters with a shearing machine, the outer copper foil is, and finally, the vertical burning test is conducted according to UL 94.

According to the UL 94 flammability retardancy test standard, a V0 rating indicates that after two 10-second flame tests on the test specimen, burning stops within 10 seconds and no burning drips are produced; a VI rating indicates that after two 10-second flame tests on the test specimen, burning stops within 60 seconds and no burning drips are produced. In this test, 5 specimen pieces are taken from each group of samples for five UL 94 flammability tests, with each test using a new specimen to re-test its flame retardancy.

Table 1 below lists the burning time (in seconds) of each specimen in the UL 94 vertical burning test after the first 10-second flame test and removal of the flame, and the burning time (in seconds) after the second 10-second flame test and removal of the flame. As shown in Table 1, for the first specimen of Example 1 after the UL 94 vertical burning test, there was no continued burning after the first 10-second flame test and removal of the flame, nor after the second 10-second flame test and removal of the flame.

3.2. Preparation of Compound (A) Having a Structure of Formula (I)

First, 216.2 g (1 mol) of DOPO (CAS No. 35948-25-5), 470.5 g (5 mol) of phenol (CAS No. 108-95-2), 136.2 g (1 mol) of 4'-hydroxyacetophenone (CAS No. 99-93-4), and 8.65 g (4 wt % based on the weight of DOPO) of p-toluenesulfonic acid (CAS No. 104-15-4) were added into a 3000-mililiter three-neck flask and uniformly stirred under room temperature. Subsequently, the three-neck flask was heated to 130° C. and stirred at the same temperature for 6 hours to obtain a mixture. After the temperature of the mixture was cooled to room temperature, an intermediate product was separated from the mixture. The intermediate product was washed using ethanol and then filtrated and dried to obtain a bisphenol-type DOPO-based compound A1 with the following structure as white powders. The yield of bisphenol-type DOPO-based compound A1 was 85%, with a melting point of 306° C. The results of elemental analysis of the bisphenol-type DOPO-based compound A1 were: carbon element 72.48%, hydrogen element 4.65%, and oxygen element 14.90%.

Bisphenol-Type DOPO-Based Compound A1

245 g (0.572 mol) of the bisphenol-type DOPO-based compound A1, 400 g of dimethyl sulfoxide (CAS No. 67-68-5) and 96.1 g of 49% NaOH were added into a 1-liter three-neck flask and mixed. The mixture was then heated to 60° C. under continuous stirring. Subsequently, 93.9 g of allyl chloride was added to the three-neck flask to perform a reaction, continuing until the salt by-product had completely precipitated. The crude product underwent oil-water phase extraction. The oil phase was extracted and concentrated to remove the solvent, yielding 240 g of a plate yellow DOPO group-containing diallyl ether compound A2 with the following structure.

Diallyl Ether Compound A2

Afterward, 240 g of the DOPO group-containing diallyl ether compound A2 was added to a 0.5-liter three-neck flask and heated to 220° C., and stirred at the same temperature for 2 hours to perform Claisen rearrangement of allyl. The compound (A) having a structure of formula (I) was obtained after the completion of Claisen rearrangement was confirmed by a Fourier transform infrared spectrometer.

3.3. Preparation of Flame-Retardant Composition

Example 1

13 g of 4,4'-bismaleimidodiphenylmethane (CAS No. 13676-54-5), 14 g of a phenylmethane maleimide oligomer (model: BES1-5950, available from Regina Chemical China) and 27 g of 2,2'-diallyl bisphenol A (CAS No. 1745-89-7) were added into a beaker and heated to 150° C. Afterward, 6 g of the compound (A) having the structure of formula (I) as prepared above was added into the beaker and stirred for 30 minutes. 40 g of methyl ethyl ketone was added into the beaker and stirred uniformly, producing 100 g of the flame-retardant composition of Example 1. The phosphorus content of the flame-retardant composition of Example 1 is 0.61 wt %.

Example 2

12.5 g of 4,4'-bismaleimidodiphenylmethane, 13.5 g of the phenylmethane maleimide oligomer BES1-5950 and 26.5 g of 2,2'-diallyl bisphenol A were added into a beaker and heated to 150° C. Afterward, 7.5 g of the compound (A) having the structure of formula (I) as prepared above was added into the beaker and stirred for 30 minutes. 40 g of methyl ethyl ketone was added into the beaker and stirred uniformly, producing 100 g of the flame-retardant composition of Example 2. The phosphorus content of the flame-retardant composition of Example 2 is 0.76 wt %.

Example 3

12 g of 4,4'-bismaleimidodiphenylmethane, 13 g of the phenylmethane maleimide oligomer BES1-5950 and 26 g of 2,2'-diallyl bisphenol A were added into a beaker and heated to 150° C. Afterward, 9 g of the compound (A) having the structure of formula (I) as prepared above was added into the beaker and stirred for 30 minutes. 40 g of methyl ethyl ketone was added into the beaker and stirred uniformly, producing 100 g of the flame-retardant composition of Example 3. The phosphorus content of the flame-retardant composition of Example 3 is 0.91 wt %.

Comparative Example 1

13 g of 4,4'-bismaleimidodiphenylmethane, 14 g of the phenylmethane maleimide oligomer BES1-5950 and 27 g of 2,2'-diallyl bisphenol A were added into a beaker and heated to 150° C., and then stirred for 30 minutes. 46 g of methyl ethyl ketone was added into the beaker and stirred uniformly, producing 100 g of the flame-retardant composition of Comparative Example 1. The phosphorus content of the flame-retardant composition of Comparative Example 1 is 0 wt %.

Comparative Example 2

13 g of 4,4'-bismaleimidodiphenylmethane, 14 g of the phenylmethane maleimide oligomer BES1-5950 and 27 g of 2,2'-diallyl bisphenol A were added into a beaker and heated to 150° C. Afterward, 6 g of DOPO (CAS No. 35948-25-5) was added into the beaker and stirred for 30 minutes. 40 g of methyl ethyl ketone was added into the beaker and stirred uniformly, producing 100 g of the flame-retardant composition of Comparative Example 2. The phosphorus content of the flame-retardant composition of Comparative Example 2 is 1.43 wt %.

Comparative Example 3

13 g of 4,4'-bismaleimidodiphenylmethane, 14 g of the phenylmethane maleimide oligomer BES1-5950 and 27 g of 2,2'-diallyl bisphenol A were added into a beaker and heated to 150° C. Afterward, 6 g of the bisphenol-type DOPO-based compound A1 as prepared above was added into the beaker and stirred for 30 minutes. 40 g of methyl ethyl ketone was added into the beaker and stirred uniformly, producing 100 g of the flame-retardant composition of Comparative Example 3. The phosphorus content of the flame-retardant composition of Comparative Example 3 is 0.72 wt %.

Comparative Example 4

13 g of 4,4'-bismaleimidodiphenylmethane, 14 g of the phenylmethane maleimide oligomer BES1-5950 and 27 g of 2,2'-diallyl bisphenol A were added into a beaker and heated to 150° C. Afterward, 6 g of the diallyl ether compound A2 as prepared above was added into the beaker and stirred for 30 minutes. 40 g of methyl ethyl ketone was added into the beaker and stirred uniformly, producing 100 g of the flame-retardant composition of Comparative Example 4. The phosphorus content of the flame-retardant composition of Comparative Example 4 is 0.61 wt %.

Comparative Example 5

14 g of 4,4'-bismaleimidodiphenylmethane, 15 g of the phenylmethane maleimide oligomer BES1-5950 and 28 g of 2,2'-diallyl bisphenol A were added into a beaker and heated to 150° C. Afterward, 3 g of the compound (A) having the structure of formula (I) as prepared above was added into the beaker and stirred for 30 minutes. 40 g of methyl ethyl ketone was added into the beaker and stirred uniformly, producing 100 g of the flame-retardant composition of Comparative Example 5. The phosphorus content of the flame-retardant composition of Comparative Example 5 is 0.31 wt %.

Comparative Example 6

13.5 g of 4,4'-bismaleimidodiphenylmethane, 14.5 g of the phenylmethane maleimide oligomer BES1-5950 and 27.5 g of 2,2'-diallyl bisphenol A were added into a beaker and heated to 150° C. Afterward, 4.5 g of the compound (A) having the structure of formula (I) as prepared above was added into the beaker and stirred for 30 minutes. 40 g of methyl ethyl ketone was added into the beaker and stirred uniformly, producing 100 g of the flame-retardant composition of Comparative Example 6. The phosphorus content of the flame-retardant composition of Comparative Example 6 is 0.46 wt %.

3.4. Characteristics of Flame-Retardant Composition

The properties of the flame-retardant composition of Examples 1 to 3 and Comparative Examples 1 to 6, including $T_d5$, 800° C. carbon residue, Tg, total expansion from 50° C. to 260° C., and flame retardancy (represented by UL94 V0) were tested according to the aforementioned testing methods, and the results are tabulated in Table 1.

Figure 1:
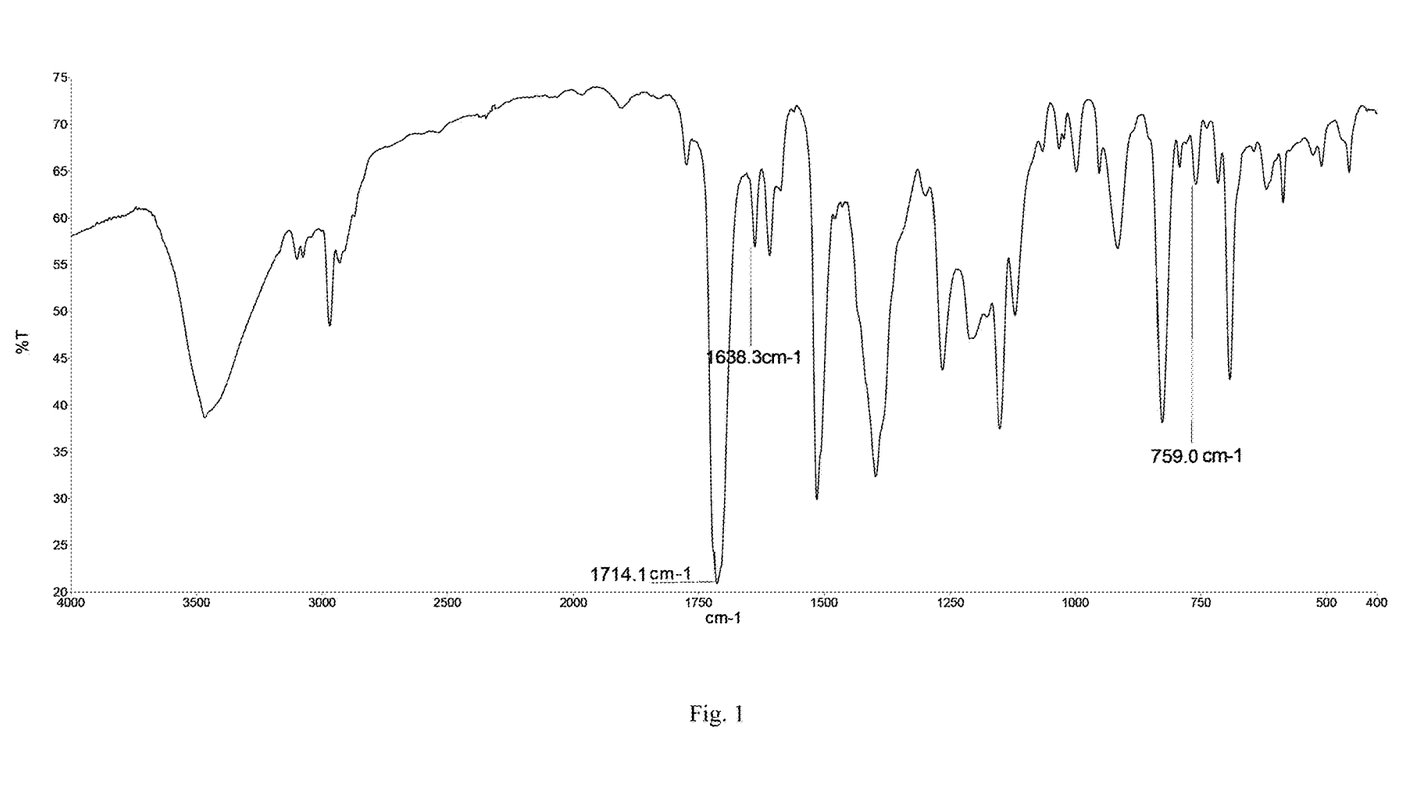
FIG. 1 shows the infrared spectrum obtained by measuring the flame-retardant composition of Example 1 using Fourier transform infrared spectroscopy (FTIR).
Figure 2:
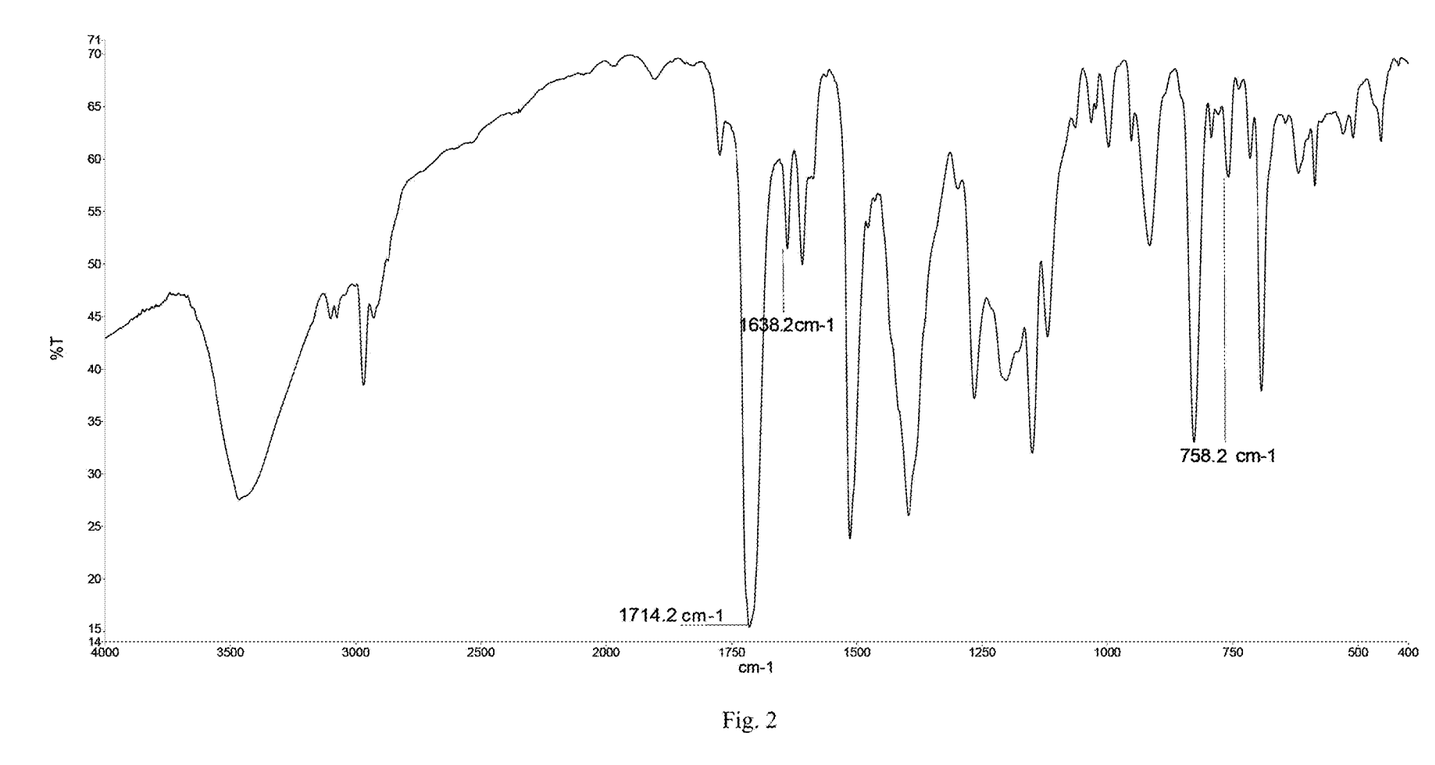
FIG. 2 shows the infrared spectrum obtained by measuring the flame-retardant composition of Example 2 using FTIR.

In addition, the infrared spectra of Examples 1 and 2 were measured according to the method described above, and the results are shown in FIG. 1 and FIG. 2. FIG. 1 shows the infrared spectrum of the flame-retardant composition of Example 1, and FIG. 2 shows the infrared spectrum of the flame-retardant composition of Example 2. As can be seen from FIG. 1 and FIG. 2, the flame-retardant composition of the present invention has a P—O—Ph absorption peak at 751 cm$^{-1}$ to 760 cm$^{-1}$, a C=O absorption peak at 1705 cm$^{-1}$ to 1715 cm$^{-1}$, and a C=C absorption peak at 1637 cm$^{-1}$ to 1639 cm$^{-1}$.

TABLE 1

Properties of flame-retardant compositions of Examples 1 to 3 and Comparative Examples 1 to 6

|  |  | Example | | | Comparative Example | | | | | |
|---|---|---|---|---|---|---|---|---|---|---|
|  |  | 1 | 2 | 3 | 1 | 2 | 3 | 4 | 5 | 6 |
| Tg (° C.) |  | 209.0 | 193.8 | 182.2 | 255.9 | 143.4 | 210.9 | 203.1 | 242.9 | 227.3 |
| $T_d5$ (° C.) |  | 379.5 | 371.0 | 363.6 | 412.0 | 331.3 | 320.1 | 382.1 | 385.5 | 382.1 |
| 800° C. carbon residue (%) |  | 45.4 | 43.2 | 43.0 | 31.7 | 46.2 | 35.3 | 40.0 | 47.5 | 46.8 |
| Total expansion from 50° C. to 260° C. (%) |  | 2.0 | 2.2 | 2.3 | 1.2 | 2.9 | 1.0 | 2.2 | 1.5 | 1.8 |
| UL94 V0 (unit: second) | 1$^{st}$ | 0/0 | 0/0 | 0/0 | 16.2/0 | 0/0 | 0/0 | 0/0 | 16.3/0 | 0/0 |
|  | 2$^{nd}$ | 2.8/0 | 0/0 | 0/0 | 15.3/0 | 0/0 | 0/0 | 0/0 | 16.1/0 | 13.3/0 |
|  | 3$^{rd}$ | 0/0 | 0/0 | 0/0 | 16.6/0 | 0/0 | 0/0 | 0/0 | 18.6/0 | 0/0 |
|  | 4$^{th}$ | 0/0 | 0/0 | 0/0 | 12.2/0 | 0/0 | 0/0 | 11.0/0 | 0/0 | 18.6/0 |
|  | 5$^{th}$ | 2.1/0 | 0/0 | 0/0 | 17.3/0 | 0/0 | 0/0 | 0/0 | 10.7/0 | 13.2/0 |

Generally, electronic materials applied to printed circuit boards with high dimensional stability usually need to possess the following properties: a Tg between 180° C. and 220° C., a $T_d5$ between 360° C. and 385° C., a 800° C. carbon residue between 42 wt % to 48 wt %, and a total expansion between 50° C. and 260° C. of 1.8% to 2.3%. As shown in Table 1, the flame-retardant composition of the present invention simultaneously possesses excellent flame retardancy (UL94 V0), excellent thermal resistance (Tg, $T_d5$, 800° C. carbon residue), and good dimensional stability (total expansion from 50° C. to 260° C.). Therefore, the flame-retardant composition of the present invention is particularly suitable for application in the preparation of printed circuit boards.

In contrast, as shown in Table 1, the flame-retardant composition no belonging to the present application cannot simultaneously possess excellent flame retardancy (UL94 V0), excellent thermal resistance (Tg, $T_d5$, 800° C. carbon residue), and good dimensional stability (total expansion from 50° C. to 260° C.). Specifically, Comparative Example 1 shows that, if the flame-retardant composition does not use phosphorus-containing compounds, the flame retardancy, thermal resistance and dimensional stability are all poor. Comparative Examples 2 to 4 show that, if the flame-retardant composition uses other phosphorus-containing compounds that do not have the structure of formula (I), it still cannot possess both excellent thermal resistance and dimensional stability. Comparative Examples 5 and 6 show that, even if the flame-retardant composition comprises the compound (A) having the structure of formula (I), if the overall phosphorus content is less than 0.5 wt %, the flame retardancy is poor, and it still cannot possess both excellent thermal resistance and dimensional stability.

The above embodiments are merely illustrative description of the principles and effects of the present invention and are intended to explain the inventive features of the present invention, not to limit the scope of protection of the present invention. Any modifications or arrangements easily accomplished by persons skilled in this field are within the scope claimed by the present invention. Therefore, the scope of protection of the present invention is defined by the appended claims.

What is claimed is:

1. A flame-retardant composition, comprising:

(A) a compound having the structure of formula (I),

[Formula (I)]

(B) a maleimide compound; and (C) an allyl-containing compound, having a structure different from formula (I), wherein the flame-retardant composition has a phosphorus content ranging from 0.5 wt % to 1.4 wt % based on the total weight of the flame-retardant composition excluding solvent.

2. The flame-retardant composition of claim 1, wherein based on the total weight of the flame-retardant composition excluding solvent, the content of the compound (A) ranges from 8 wt % to 20 wt %.

3. The flame-retardant composition of claim 2, further comprising a thermosetting resin selected from the group consisting of an epoxy resin, a thermosetting phenolic resin, a thermosetting benzoxazine resin, a thermosetting polyphenylene ether resin, and combinations thereof.

4. The flame-retardant composition of claim 2, further comprising an additive selected from the group consisting of a hardening promoter, a catalyst, an elastomer, a filler, a toughener, and combinations thereof.

5. The flame-retardant composition of claim 1, wherein based on the total weight of the flame-retardant composition excluding solvent, the content of the maleimide compound (B) ranges from 20 wt % to 55 wt %.

6. The flame-retardant composition of claim 5, further comprising a thermosetting resin selected from the group consisting of an epoxy resin, a thermosetting phenolic resin, a thermosetting benzoxazine resin, a thermosetting polyphenylene ether resin, and combinations thereof.

7. The flame-retardant composition of claim 3, further comprising an additive selected from the group consisting of a hardening promoter, a catalyst, an elastomer, a filler, a toughener, and combinations thereof.

8. The flame-retardant composition of claim 1, wherein based on the total weight of the flame-retardant composition excluding solvent, the content of the allyl-containing compound (C) ranges from 20 wt % to 55 wt %.

9. The flame-retardant composition of claim 1, wherein the maleimide compound (B) is a multi-functional maleimide compound.

10. The flame-retardant composition of claim 5, wherein the maleimide compound (B) is selected from the group consisting of and combinations thereof, wherein n is an integer ranging from 1 to 10.

11. The flame-retardant composition of claim 9, wherein the maleimide compound (B) is selected from the group consisting of 1,2-bismaleimidoethane, 1,6-bismaleimidohexane, 1,3-bismaleimidobenzene, 1,4-bismaleimidobenzene, 2,4-bismaleimidotoluene, 4,4'-bismaleimidodiphenylmethane, 4,4'-bismaleimidodiphenyl ether, 3,3'-bismaleimidodiphenyl sulfone, 4,4'-bismaleimidodiphenyl sulfone, 4,4'-bismaleimidodicyclohexylmethane, 3,5-bis(4-maleimidophenyl)pyridine, 2,6-bismaleimidopyridine, 1,3-bis(maleimidomethyl)cyclohexane, 1,3-bis(maleimidomethyl)benzene, 1,1-bis(4-maleimidophenyl)cyclohexane, 1,3-bis(dichloromaleimido)benzene, 4,4'-biscitraconimidodiphenylmethane, 2,2-bis(4-maleimidophenyl)propane, 1-phenyl-1,1-bis(4-maleimidophenyl)ethane, α,α-bis(4-maleimidophenyl)toluene, 3,5-bismaleimido-1,2,4-triazole, N,N'-ethylenebismaleimide, N,N'-hexamethylenebismaleimide, N,N'-m-phenylenebismaleimide, N,N'-p-phenylenebismaleimide, N,N'-α,α'-4,4'-dimethylenecyclohexane bismaleimide, N,N'-m-dimethylphenylbismaleimide, N,N'-4,4'-diphenylcyclohexane bismaleimide, a phenylmethane maleimide oligomer, and combinations thereof.

12. The flame-retardant composition of claim 1, wherein the allyl-containing compound (C) is a multi-functional allyl-containing compound.

13. The flame-retardant composition of claim 12, wherein the allyl-containing compound (C) is selected from the group consisting of diallyl bisphenol A, diallyl bisphenol F, diallyl bisphenol S, and combinations thereof.

14. The flame-retardant composition of claim 1, further comprising a prepolymer of the compound (A), the maleimide compound (B) and the allyl-containing compound (C).

15. The flame-retardant composition of claim 14, wherein the prepolymer has a structure of the following formula (II) or formula (III):

[Formula (II)]

-continued

[Formula (III)]

wherein $R_B$ is a structural unit derived from the maleimide compound (B), and $R_C$ is a structural unit derived from the allyl-containing compound (C).

16. The flame-retardant composition of claim 1, further comprising a thermosetting resin selected from the group consisting of an epoxy resin, a thermosetting phenolic resin, a thermosetting benzoxazine resin, a thermosetting polyphenylene ether resin, and combinations thereof.

17. The flame-retardant composition of claim 1, further comprising an additive selected from the group consisting of a hardening promoter, a catalyst, an elastomer, a filler, a toughener, and combinations thereof.

18. A metal-clad laminate, which is prepared by coating the flame-retardant composition of claim 1 onto a metal foil and drying the coated metal foil.

19. A prepreg, which is prepared by impregnating a substrate with the flame-retardant composition of claim 1 or by coating the flame-retardant composition of claim 1 onto a substrate and drying the impregnated or coated substrate.

20. A metal-clad laminate, which is prepared by laminating the prepreg of claim 19 and a metal foil.

* * * * *